United States Patent
Truong et al.

(10) Patent No.: US 8,250,445 B2
(45) Date of Patent: Aug. 21, 2012

(54) DECODING METHOD AND ERROR CORRECTION METHOD OF A CYCLIC CODE DECODER

(75) Inventors: Trieu-Kien Truong, Dashu Township, Kaohsiung County (TW); Tsung-Ching Lin, Dashu Township, Kaohsiung County (TW); Hsin-Chiu Chang, Dashu Township, Kaohsiung County (TW); Hung-Peng Lee, Dashu Township, Kaohsiung County (TW)

(73) Assignee: I Shou University, Kaohsiung County (TW)

( * ) Notice: Subject to any disclaimer, the term of this patent is extended or adjusted under 35 U.S.C. 154(b) by 904 days.

(21) Appl. No.: 12/316,038

(22) Filed: Dec. 8, 2008

(65) Prior Publication Data

US 2009/0287983 A1    Nov. 19, 2009

(51) Int. Cl.
*G06F 11/00* (2006.01)
(52) U.S. Cl. .................................. 714/781; 714/785
(58) Field of Classification Search ............... 714/781, 714/785
See application file for complete search history.

(56) References Cited

U.S. PATENT DOCUMENTS

| | | | | |
|---|---|---|---|---|
| 4,541,095 A | * | 9/1985 | Vries | 714/785 |
| 6,145,110 A | * | 11/2000 | Khayrallah | 714/752 |
| 6,421,807 B1 | * | 7/2002 | Nakamura et al. | 714/781 |
| 7,500,173 B2 | * | 3/2009 | Paul et al. | 714/807 |
| 7,562,283 B2 | * | 7/2009 | Falik et al. | 714/785 |
| 7,665,010 B2 | * | 2/2010 | Fisher-Jeffes et al. | 714/792 |
| 2002/0108090 A1 | * | 8/2002 | Ariel et al. | 714/792 |
| 2002/0178421 A1 | * | 11/2002 | Hassner et al. | 714/781 |
| 2006/0200729 A1 | * | 9/2006 | Ito et al. | 714/763 |
| 2010/0125776 A1 | * | 5/2010 | Mutchnik et al. | 714/785 |

* cited by examiner

*Primary Examiner* — Marc Duncan
(74) *Attorney, Agent, or Firm* — Kilpatrick Townsend & Stockton LLP

(57) ABSTRACT

A decoding method of a cyclic code decoder includes the machine-implemented steps of: establishing a lookup table; receiving a codeword; computing a syndrome and a Hamming weight; if the Hamming weight is not equal to zero and not greater than an error correcting capability value, performing a first error correcting operation; if the Hamming weight is greater than the error correcting capability value, and if the syndrome has a matching syndrome pattern in the lookup table, performing a second error correcting operation; if a second Hamming weight corresponding to a syndrome difference is smaller than a check value, performing a third error correcting operation, otherwise performing a fourth error correcting operation; and if a counter value is greater than zero, performing a fifth error correcting operation before decoding a corrected codeword.

14 Claims, 2 Drawing Sheets

DECODING METHOD AND ERROR CORRECTION METHOD OF A CYCLIC CODE DECODER

BACKGROUND OF THE INVENTION

1. Field of the Invention

The present invention relates to a decoding method and an error correction method, more particularly to a cyclic code decoding method and an error correction method for a cyclic code decoder.

2. Description of the Related Art

Audio and video signals, such as signals for digital televisions, blue-tooth earphones, digital video discs, or wireless application protocol mobile phones, are usually processed through a digital decoding method.

Nowadays, use of a cyclic code in an algebraic method or a lookup table method is common in various applications.

The algebraic decoding method generates polynomial formulas including error position polynomials to correct error bit values. Nevertheless, this method requires a large amount of computing resources, and is more complicated and time-consuming than a lookup table method.

On the other hand, storing a conventional lookup table requires a large memory space, and the bigger the lookup table, the longer the time period required by the decoding process.

It is therefore a critical issue for the academic and industrial sectors to find a more efficient and less complicated decoding method for cyclic codes.

SUMMARY OF THE INVENTION

Therefore, an object of the present invention is to provide a decoding method and an error correction method implemented on a machine with a processor and a memory that can reduce the size requirement of a lookup table.

Accordingly, there is provided a cyclic code decoding method having an error correcting capability associated with an error correcting capability value. The decoding method comprises the machine-implemented steps of:

(a) establishing a lookup table including at least one syndrome pattern and one error pattern corresponding to the syndrome pattern;
(b) receiving a codeword;
(c) initializing a counter value to an initial value;
(d) computing a syndrome of the codeword and a first Hamming weight corresponding to the syndrome;
(e) if the first Hamming weight has a non-zero value that is not greater than the error correcting capability value, performing a first error correcting operation upon the codeword with reference to the syndrome;
(f) if the first Hamming weight has a non-zero value that is greater than the error correcting capability value, and if the syndrome has a matching syndrome pattern in the lookup table, performing a second error correcting operation upon the codeword with reference to the error pattern that corresponds to the matching syndrome pattern;
(g) if the first Hamming weight has a non-zero value that is greater than the error correcting capability value, and if the syndrome does not have a matching syndrome pattern in the lookup table:
   (g1) choosing a syndrome pattern from the lookup table;
   (g2) obtaining a syndrome difference by subtracting the syndrome pattern chosen in sub-step (g1) from the syndrome;
   (g3) computing a second Hamming weight corresponding to the syndrome difference;
   (g4) if the second Hamming weight is not greater than a predetermined check value, performing a third error correcting operation upon the codeword with reference to the syndrome difference and the error pattern corresponding to the syndrome pattern chosen in sub-step (g1); and
   (g5) if the second Hamming weight is greater than the predetermined check value, performing a fourth error correcting operation upon the codeword with reference to a predetermined codeword bit length and a predetermined codeword message bit length to result in a new codeword, incrementing the counter value, and going back to step (d);
(h) if the counter value is not larger than the initial value after determining that the first Hamming weight has a zero value or after any one of the first, second and third error correcting operations, performing decoding of the corrected codeword; and
(i) if the counter value is larger than the initial value after determining that the first Hamming weight has a zero value or after any one of the first, second and third error correcting operations, performing a fifth error correcting operation upon the corrected codeword with reference to the counter value, the predetermined codeword bit length and the predetermined codeword message bit length to obtain a further corrected codeword, followed by decoding the further corrected codeword.

In the decoding method of this invention, it is not required to store all possible syndrome patterns and their corresponding error patterns in the lookup table. Accordingly, the size of the lookup table is reduced, and the decoding speed can be increased.

BRIEF DESCRIPTION OF THE DRAWINGS

Other features and advantages of the present invention will become apparent in the following detailed description of the preferred embodiment with reference to the accompanying drawing, of which.

DETAILED DESCRIPTION OF THE PREFERRED EMBODIMENT

Figure 1A:
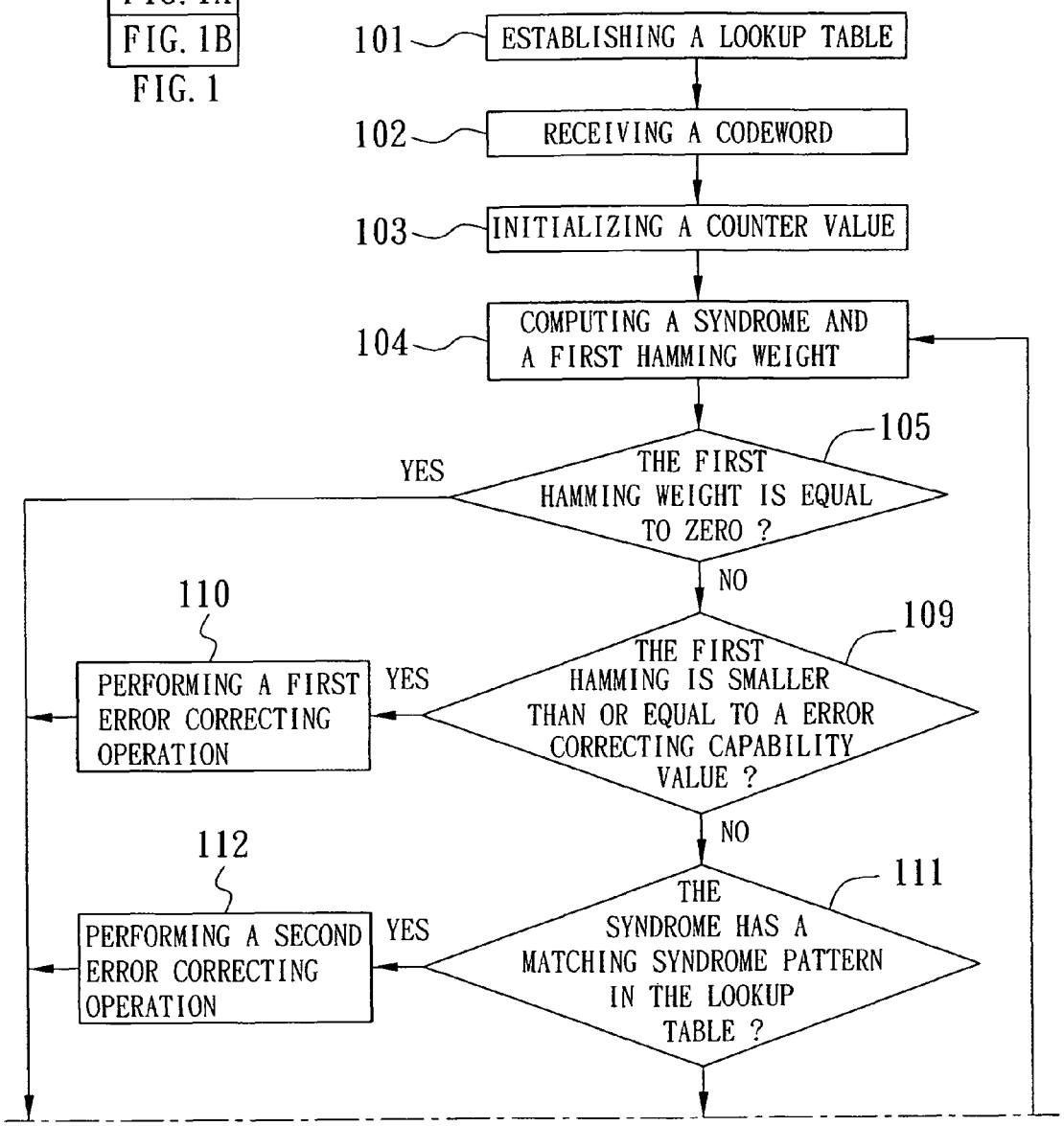
FIG. 1 is a flowchart of the preferred embodiment of a decoding method of a cyclic code decoder according to the present invention.
Figure 1B:
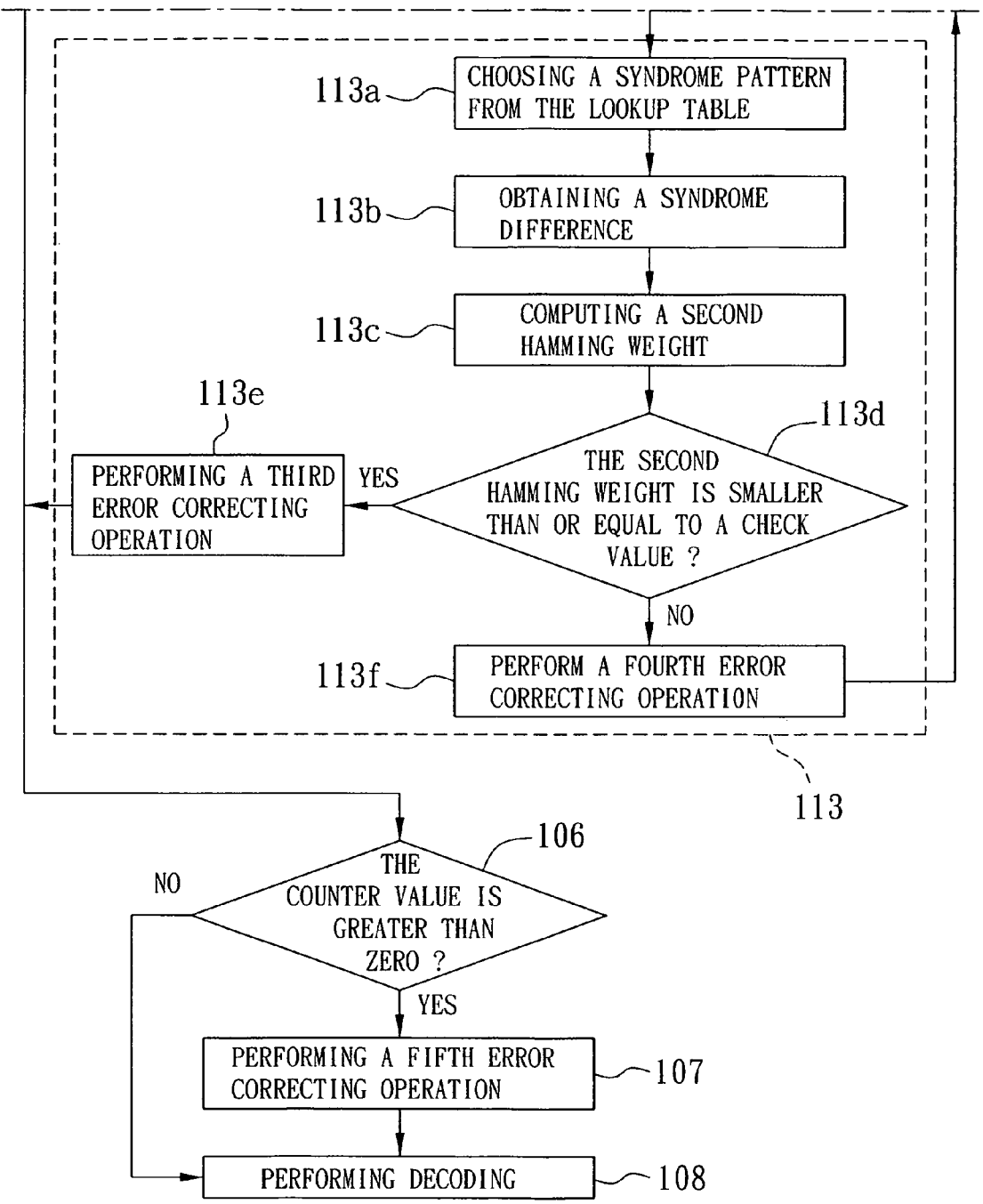

Referring to FIG. 1, the preferred embodiment of a decoding method of a cyclic code decoder according to the present invention is shown to be adapted for correcting errors in received codewords before decoding the same. The decoding method includes the following machine-implemented steps:

First, as shown in the step 101, a lookup table including at least one syndrome pattern and one error pattern corresponding to the syndrome pattern is established.

The syndrome pattern represents an error state of a codeword, while the error pattern associated with the syndrome pattern in the lookup table is used for correcting the error bits of the erroneous codeword.

Preferably, the lookup table is stored in a storage unit, such as a non-volatile memory, and is established according to the following.

Let t be an error correcting capability value associated with an error correcting capability of a cyclic code having a total bit length (n), a message bit length (k) and a codeword Hamming distance ($d_{min}$); then $t \leq (d_{min}-1)/2$.

According to the invention, while a conventional lookup table comprises $$\sum_{i=1}^{T} C_i^n$$

error patterns, where $$C_i^n = \frac{[n(n-1)\dots(n-i+1)]}{[i(i-1)\dots 1]}$$

is a mathematic combination computing symbol and (T) is the highest value of (t), the lookup table of this invention includes $$\sum_{i=1}^{\lceil T/2 \rceil} C_i^k$$

syndromes patterns and corresponding error patterns, where $$C_i^k = \frac{k(k-1)\dots(k-i+1)}{i(i-1)\dots(2)(1)},$$

and $\lceil T/2 \rceil$ is (T) divided by 2 and rounded up to the next integer.

The lookup table according to this invention is actually derived from the conventional lookup tables, and is established by obtaining the $C_i^k$ error patterns of the conventional lookup table that correspond to the error correcting capability value t=i and the message bit length (k), for (i) from 1 to $\lceil T/2 \rceil$.

As an example, for a Gray Code (23, 12, 7), the highest value (T) of the error correcting capability value (t) is 3. Then, a conventional lookup table comprises $$\sum_{i=1}^{t} C_i^n = \sum_{i=1}^{3} C_i^{23} = C_1^{23} + C_2^{23} + C_3^{23} = 23 + 253 + 1771 = 2047$$

error patterns, while the lookup table of the preferred embodiment only comprises $$\sum_{i=1}^{\lceil T/2 \rceil} C_i^k = \sum_{i=1}^{2} C_i^k = C_1^{12} + C_2^{12} = 12 + 66 = 78$$

error patterns.

The first $C_1^{12}=12$ error patterns are established by selecting the 12 error patterns that correspond to the k=12 message bits of the cyclic code having the total bit length n=23 among the $C_1^{23}=23$ error patterns of the conventional lookup table that correspond to the error correcting capability value t=2, and the last $C_2^{12}=66$ error patterns are established by selecting the 66 error patterns that correspond to the k=12 message bits of the cyclic code having the total bit length n=23 among the $C_2^{23}=253$ error patterns of the conventional lookup table that correspond to the error correcting capability value t=2.

Next, following the establishment of the lookup table in step 101, a codeword including a sequence of bits is received in step 102, and a counter value (i) is initialized to an initial value in step 103.

In this embodiment, the initial value is zero. The counter value is used to count a number of times of performing a predetermined error correcting operation.

Next, in step 104, the cyclic code decoder computes a syndrome of the received codeword and a first Hamming weight corresponding to the syndrome. The syndrome is defined to be $(rH^T)$, where (r) is the received codeword, (H) is a parity checking matrix, and ($H^T$) is the transform matrix of (H). Besides, the first Hamming weight corresponding to this syndrome is computed by adding up the non-zero components of the syndrome.

Next, in step 105, the cyclic code decoder determines whether the first Hamming weight is zero.

If the first Hamming weight has a non-zero value, noise during transmission of the codeword generated bit errors. Error correction is then required, and the flow goes to step 109.

If the first Hamming weight is zero, i.e., the syndrome is zero, on error was generated during the transmission of the codeword. The cyclic code decoder then determines whether the counter value is greater than the initial value in a subsequent step 106.

In step 106, if the counter value is equal to the initial value, which is zero in this embodiment, the decoding of the codeword is performed in step 108.

On the other hand, if the counter value is larger than the initial value, the cyclic code decoder performs a fifth error correcting operation in step 107, and then decodes the codeword corrected in step 107 in a subsequent step 108. Preferably, the fifth error correcting operation includes cyclically shifting the codeword to the right by i×(n−k), i.e., by a product of the counter value (i) and a difference between the codeword bit length (n) and the codeword message bit length (k).

In step 109, the cyclic code decoder determines if the first Hamming weight is greater than the error correcting capability value (t).

If the first Hamming weight is greater than the error correcting capability value (t), the codeword includes at least one error, and the flow proceeds to step 111.

On the other hand, if the first Hamming weight is not greater than the error correcting capability value (t), the codeword includes no more than (t) errors, and the flow goes to step 110 for performing a first error correcting operation upon the codeword with reference to the syndrome. Preferably, the first error correcting operation includes cyclically shifting the syndrome to the left by the codeword message bit length (k) to obtain a first correction factor, and subsequently subtracting this first correction factor from the codeword.

It is then determined if the counter value (i) has a non-zero value in step 106.

As mentioned hereinbefore, if the counter value (i) is equal to the initial value, the cyclic code decoder decodes the codeword corrected in step 110 in a subsequent step 108. Otherwise, the cyclic code decoder performs step 107 and decodes the codeword corrected in step 107 in the subsequent step 108.

In step 111, the cyclic code decoder searches for a match between the syndrome computed in step 104 and the syndrome patterns in the lookup table.

If the syndrome has a matching syndrome pattern in the lookup table, the codeword comprises at the most (t−1) errors and the cyclic code decoder performs a second error correcting operation in step 112 upon the codeword with reference to the error pattern that corresponds to the matching syndrome pattern. Preferably, the second error correcting operation includes subtracting the error pattern that corresponds to the matching syndrome pattern from the codeword.

The cyclic code decoder then proceeds with the aforementioned steps 106 to 108 to decode the codeword corrected in step 112.

Preferably, the search method of step 111 for finding a matching syndrome pattern in the lookup table is one of a binary search algorithm, a sequential search, and a hashed list search. More preferably, the search method is the binary search algorithm as practical experiments have shown that it optimized the decoding speed. Nevertheless, the search method of step 111 is not limited to the disclosed search methods and is intended to cover various present and future techniques depending on the application by a skilled person.

If it is determined in step 111 that the syndrome does not have a matching syndrome pattern in the lookup table, the flow proceeds to step 113.

Step 113 includes sub-steps (113a) to (113f). In step (113a), a syndrome pattern from the lookup table is chosen.

Subsequently, in sub-step (113b), the syndrome pattern chosen in step (113a) is subtracted from the syndrome computed in step 104 to obtain a syndrome difference, and a second Hamming weight corresponding to the syndrome difference is computed in sub-step (113c).

It is then determined in sub-step (113d) if the second Hamming weight is greater than a check value ($C_s$).

If the second Hamming weight is greater than the check value ($C_s$), the flow proceeds to sub-step (113f).

If the second Hamming weight is not greater than the check value ($C_s$), the flow goes to sub-step (113e), where the cyclic code decoder performs a third error correcting operation upon the codeword with reference to the syndrome difference and the error pattern corresponding to the syndrome pattern chosen in sub-step (113a) Preferably, the third correcting operation includes cyclically shifting the syndrome difference to the left by the codeword message bit length (k) to obtain a second correction factor, and subsequently subtracting this second correction factor and the error pattern corresponding to the syndrome pattern chosen in sub-step (113a) from the codeword.

The cyclic code decoder then proceeds with the aforementioned steps 106 to 108 to decode the codeword corrected in sub-step (113e).

Preferably, the check value ($C_s$) is:

$$C_s = \min[w(s_i)] - t - 1,$$

where ($s_i$) is the syndrome pattern chosen in sub-step (113a), $w(s_i)$ is the second Hamming weight corresponding to the syndrome pattern ($s_i$), and (t) is the error correcting capability value.

Last, in sub-step (113f), the cyclic code decoder performs a fourth correcting operation by cyclically shifting the codeword to the left by a difference between the codeword bit length (n) and the codeword message bit length (k). In sub-step (113f), the counter value (i) is incremented by one, and the flow subsequently goes back to step 104.

From the above description, the decoding method of this invention uses characteristics of the cyclic code to correct and decode a received codeword for implementing a reduced lookup table, thereby saving memory space and increasing the decoding speed.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A cyclic code decoding method having an error correcting capability associated with an error correcting capability value, comprising the machine-implemented steps of:

establishing a lookup table including at least one syndrome pattern and one error pattern corresponding to said syndrome pattern;

receiving a codeword;

initializing a counter value to an initial value;

computing a syndrome of said codeword and a first Hamming weight corresponding to said syndrome;

if said first Hamming weight has a non-zero value that is not greater than said error correcting capability value, performing a first error correcting operation upon said codeword with reference to said syndrome;

if said first Hamming weight has a non-zero value that is greater than said error correcting capability value, and if said syndrome has a matching syndrome pattern in said lookup table, performing a second error correcting operation upon said codeword with reference to the error pattern that corresponds to the matching syndrome pattern;

if said first Hamming weight has a non-zero value that is greater than said error correcting capability value, and if said syndrome does not have a matching syndrome pattern in said lookup table:

(g1) choosing a syndrome pattern from said lookup table;

(g2) obtaining a syndrome difference by subtracting said syndrome pattern chosen in sub-step (g1) from said syndrome;

(g3) computing a second Hamming weight corresponding to said syndrome difference;

(g4) if said second Hamming weight is not greater than a predetermined check value, performing a third error correcting operation upon said codeword with reference to said syndrome difference and the error pattern corresponding to said syndrome pattern chosen in sub-step (g1); and (g5) if said second Hamming weight is greater than the predetermined check value, performing a fourth error correcting operation upon said codeword with reference to a predetermined codeword bit length and a predetermined codeword message bit length to result in a new codeword, incrementing the counter value, and going back to step (d);

if the counter value is not larger than the initial value after determining that said first hamming weight has a zero value or after any one of the first, second and third error correcting operations, performing decoding of the corrected codeword; and if the counter value is larger than the initial value after determining that said first hamming weight has a zero value or after any one of the first, second and third error correcting operations, performing a fifth error correcting operation upon the corrected codeword with reference to the counter value, the predetermined codeword bit length and the predetermined codeword message bit length to obtain a further corrected codeword, followed by decoding the further corrected codeword.

2. The cyclic code decoding method of claim 1, wherein said lookup table includes $$\sum_{i=1}^{\lceil T/2 \rceil} C_i^k$$

syndromes patterns and corresponding error patterns, where:

$$C_i^k = \frac{k(k-1)\ldots(k-i+1)}{i(i-1)\ldots(2)(1)}$$

t is said error correcting capability value of said cyclic code decoding method, T is the highest value of t, $\lceil T/2 \rceil$ is T divided by 2 and rounded up to the next integer, and k is said codeword message bit length;

said lookup table being established by obtaining the $C_i^k$ error patterns that correspond to the error correcting capability value t=i and the codeword message bit length k, for i from 1 to $\lceil T/2 \rceil$.

3. The cyclic code decoding method of claim 1, wherein said lookup table is stored in a non-volatile memory.

4. The cyclic code decoding method of claim 1, wherein said first error correcting operation includes
cyclically shifting said syndrome by said codeword message bit length to obtain a first correction factor; and
subtracting the first correction factor from said codeword.

5. The cyclic code decoding method of claim 1, wherein said second error correcting operation includes subtracting the error pattern that corresponds to the matching syndrome pattern from said codeword.

6. The cyclic code decoding method of claim 1, wherein said third error correcting operation includes
cyclically shifting said syndrome difference by said codeword message bit length to obtain a correction factor; and
subtracting the correction factor and the error pattern corresponding to said syndrome pattern selected in sub-step (g1) from said codeword.

7. The cyclic code decoding method of claim 1, wherein said fourth error correcting operation includes cyclically shifting said codeword by a difference between the predetermined codeword bit length and the predetermined codeword message bit length.

8. The cyclic code decoding method of claim 1, wherein said fifth error correcting operation includes cyclically shifting the corrected codeword by a product of the counter value and a difference between the predetermined codeword bit length and the predetermined codeword message bit length.

9. The cyclic code decoding method of claim 1, wherein said check value is $C_s = \min[w(s_i)] - t - 1$, where $s_i$ is said syndrome pattern chosen in sub-step (g1), t is said error correcting capability value of said cyclic code decoding method, and $w(s_i)$ is a second Hamming weight corresponding to said syndrome pattern $s_i$.

10. The cyclic code decoding method of claim 1, wherein said initial value in step (c) is zero.

11. The cyclic code decoding method of claim 1, wherein the counter value is incremented by one in sub-step (g-5).

12. An error correction method for a cyclic code decoding process having an error correcting capability associated with an error correcting capability value, comprising the steps of:
receiving a codeword;
computing, by one or more processors, a syndrome of said codeword and a Hamming weight corresponding to said syndrome; and
if said Hamming weight has a non-zero value that is not greater than said error correcting capability value, cyclically shifting, by the one or more processors, said syndrome by a predetermined codeword message bit length to obtain a correction factor, and subtracting the correction factor from said codeword.

13. An error correction method for a cyclic code decoding process having an error correcting capability associated with an error correcting capability value, comprising the machine-implemented steps of:
establishing a lookup table including at least one syndrome pattern and one error pattern corresponding to said syndrome pattern;
receiving a codeword;
computing, by one or more processors, a syndrome of said codeword and a first Hamming weight corresponding to said syndrome; and
if said first Hamming weight has a non-zero value that is greater than said error correcting capability value, and if said syndrome does not have a matching syndrome pattern in said lookup table, causing the one or more processors to:
(d1) choose a syndrome pattern from said lookup table;
(d2) obtain a syndrome pattern difference by subtracting said syndrome pattern chosen in sub-step (d1) from said syndrome;
(d3) compute a second Hamming weight corresponding to said syndrome difference; and
(d4) if said second Hamming weight is not greater than a predetermined check value, perform an error correcting operation upon said codeword with reference to said syndrome difference and the error pattern corresponding to said syndrome pattern chosen in sub-step (d1).

14. The error correction method of claim 13, wherein said error correcting operation includes
cyclically shifting said syndrome difference by a predetermined codeword message bit length to obtain a correction factor; and
subtracting the correction factor and the error pattern corresponding to said syndrome pattern selected in sub-step (d1) from said codeword.

* * * * *